United States Patent [19]

Rault

[11] Patent Number: 4,931,980
[45] Date of Patent: Jun. 5, 1990

[54] DIGITAL COMPUTING DEVICE FOR A DATA TRANSMISSION INSTALLATION USING CODE 2B 1Q OR THE LIKE

[75] Inventor: Jean-Christophe Rault, Perros Guirec, France

[73] Assignee: Etat Francais, Represente Par Le Ministre des Postes, Telecommunications et de L'Espace (Centre National d'Etude des Telecommunications) CNET, Issy Les Moulineaux, France

[21] Appl. No.: 225,493

[22] Filed: Jul. 28, 1988

[30] Foreign Application Priority Data

Jul. 30, 1987 [FR] France .................. 87 10821

[51] Int. Cl.⁵ .............................................. G06F 15/31
[52] U.S. Cl. ............................ 364/750.5; 364/724.16
[58] Field of Search ................ 364/724.16, 724.19, 364/724.2, 724.04, 750.5

[56] References Cited

U.S. PATENT DOCUMENTS

| | | | |
|---|---|---|---|
| 3,696,235 | 10/1972 | Tufts et al. ................... | 364/724.01 |
| 3,906,218 | 9/1975 | Nussbaumer .................. | 364/724.16 |
| 3,906,400 | 9/1975 | Gooding et al. ............... | 364/724.04 |
| 3,988,606 | 10/1976 | Eggermont .................... | 364/724.04 |
| 4,031,378 | 6/1977 | Le Comte ........................ | 364/760 |
| 4,185,325 | 1/1980 | Appel ............................ | 364/724.17 |
| 4,322,810 | 3/1982 | Nakayama ..................... | 364/750.5 |

*Primary Examiner*—David H. Malzahn
*Attorney, Agent, or Firm*—Larson and Taylor

[57] ABSTRACT

A device for real time computing of a sum of terms having the form $\Sigma h(iT).qe((n-i)T)$ is suitable for use in an echo canceller for a data transmission system using code 2B 1Q. The device first transforms each of the successive estimated values of $\hat{qe}$ into transformed values $\widehat{qde}$ which are powers of two, by adding or subtracting 1. The successive elementary products each obtained by a shift of h by an amount selected in response to the respective value of $\widehat{qde}$. The elementary products are summed in a register.

5 Claims, 2 Drawing Sheets

DIGITAL COMPUTING DEVICE FOR A DATA TRANSMISSION INSTALLATION USING CODE 2B 1Q OR THE LIKE

BACKGROUND OF THE INVENTION

1. Technical Field

The invention relates to digital computing devices for computing in real time a sum of terms of the form:

$$\Sigma h(iT) \cdot \hat{q}e((n-i)T)$$

in which

T designates a sampling period, h(iT) are coefficients, and qe are the estimated values of transmitted data qe, which may take on the values $-3, -1, +3$ and $+1$.

2. Prior Art

The problem of computing such a sum arises particularly in the construction of linear filters used in echo cancellers (which will be designated hereafter by the usual abbreviation ECC) for an installation for digital transmission of data using code 2B 1Q. This code is likely to be adapted as a standard following standardization of the U-interface in the United-States of America. It associates with each set of two bits, called "dibit", one level among four, in accordance with the following table:

| dibit | transmitted level |
|-------|-------------------|
| 00    | −3                |
| 01    | −1                |
| 10    | +3                |
| 11    | +1                |

The data qe(t) transmitted on line may consequently assume the four above values. In a transmission installation whose channel has a pulse response h(t), the signal sr(nT) received at time nT is:

$$sr(nT) = \sum_{i=0}^{\infty} h(iT) \cdot qe((n-i)T) \quad (1)$$

Search for the estimated values qe of qe involves, in a reception apparatus, computation of sums of the form (1). For example, whenever the transmission lines are heterogenous, the decision concerning the value of qe(nT) can only be made after subtracting, from the received signal sr(nT), an estimation of the intersymbol interference, or ISI, whose exact value would be:

$$\sum_{i=1}^{N} h(it) * qe((n-i)T)$$

Estimation is conventionally made by means of an adaptive recursive equalizer with decision within the loop, frequently designated by the abbrevation DFE, with N coefficients, which computes the term Tr(nT):

$$Tr(nT) = \sum_{i=1}^{N} \hat{h}(iT) \cdot \hat{q}e((n-i)T \quad (2)$$

where h(iT) is the nth coefficient stored in the and is an estimate of the nth sample of the pulse response h(t).

The digital computation of Tr(nT) involves, if formula (2) is applied:

N multiplications h(iT)*qe((n−i)T), and
N additions

Taking into account that the estimated data qe may only assume values $+3, +1, -3$ and $-1$ and is therefor coded over two bits, each multiplication can be broken down into two additions and a shift: the operation 3* h(iT) becomes for example:

$$\hat{h}(iT)) + 2 * \hat{h}(iT)$$

While by using this transformation, a computing device devoid of multiplier may be used, the computing time is doubled since it requires 2N cycles rather than N cycles.

It is an object of the invention to provide a device which neither requires a multiplier, nor substantially lengthens the computing time. For that, it start from a complete analysis of the transmission channel and of its components with the purpose of modify equation (2) (or the corresponding equation in the case of an ECC), into a form comprising terms which may be neglected without undesirable consequences.

A first step consists in introducing a variable $\widehat{qde} = 1 + \hat{q}e$ which, because $\hat{q}e$ can take the values $+3, +1, -3, -1$, can only take the values $+4, +2, -2, 0$ which are powers of 2. The equation (2) which gives Tr(nT) becomes, depending on the values qde((n−1)T):

$$Tr(nT) = \sum_{i=1}^{N} \hat{h}(iT) \cdot [\widehat{qde}((n-i)T) - 1] \quad (3)$$

which may also be written:

$$Tr(nT) = \sum_{i=1}^{N} \hat{h}(iT) \cdot \widehat{qde}((n-i)T) - \quad (4)$$

$$\sum_{i=1}^{N} \hat{h}(iT)$$

The second term of equation (4) may be transformed since the transmission channel stops the DC component of the signal and consequently the overall gain of the channel $$\sum_{i=0}^{\infty} h(iT)$$

for the DC component is zero. That overall gain may be written as:

$$\hat{h}(0) + \sum_{i=1}^{N} \hat{h}(iT) + \sum_{i=N+1}^{\infty} \hat{h}(iT) = 0 \quad (5)$$

Furthermore, the term $$\sum_{i=N+1}^{\infty} \hat{h}(iT)$$

may be neglected, for in a DFE having N coefficients it is accepted that the value of the "drag" beyond NT need not be taken into consideration. Equation (5) then shows that $$-\sum_{i=1}^{N} \hat{h}(iT)$$

may be replaced in (4) with $\hat{h}(0)$. The equation (4) then becomes:

$$Tr(nT) = \sum_{i=1}^{N} \hat{h}(iT) \cdot \widehat{qde}((n-i)T) + \hat{h}(0) \quad (6)$$

Since $\widehat{qde}$ is always a power of 2, computation of the first term of the equation (6) only involves N additions and possibly shifts, depending on the value of $\widehat{qde}$. Adding the second term lengthens computation by one computing cycle only. N+1 cycles are sufficient, instead of 2N cycles in the case of equation (2).

There is consequently provided a computing device comprising: means for transforming values $\hat{qe}$ into values qde which are powers of 2, by addition (or subtraction) of the same number from all the values; means for computing the elementary products obtained by possible shifts of h depending on the value of $\widehat{qde}$; means for summing the elementary products and means for possibly adding them to a constant forming an evaluation of the difference in result due to the variable change.

In the above-mentioned case in which the device forms an adaptative recursive equalizer operating in accordance with the equation (6), the constant value constitutes an evaluation $\hat{h}(0)$ of the first term of the transfer function. The values h may be continuously adapted by a network of known type, using for example the gradient algorithm or the sign algorithm.

In the case where the device is to be used as echo canceller, the synthetized echo Ec(nT) is obtained by a formula similar to equation (2), using N estimated coefficients which will be designated $\hat{g}(iT)$.

$$Ec(nT) = \sum_{i=0}^{N-1} \hat{g}(iT) * qe((n-i)T) \quad (2 \text{ bis})$$

with qe = +3, +1, -1 or -3.

Here again, for computing Ec(nT) using this formula, 2N computing cycles would be necessary if multiplications are to be avoided.

A device according to the invention effects a change of variable on the transmitted data qe:

$$\widehat{qde}((n-i)T) = 1 + qe((n-i)T)$$

then qde can only assume values +4, +2, 0 and -2. The echo may be written as:

$$Ec(nT) = \sum_{i=0}^{N-1} \hat{g}(iT) * [\widehat{qde}((n-i)T) - 1] \quad (3 \text{ bis})$$

or else:

$$Ec(nT) = \sum_{i=0}^{N-1} \hat{g}(iT) * \widehat{qde}((n-i)T) - \sum_{i=0}^{N-1} \hat{g}(iT) \quad (4 \text{ bis})$$

The second term of the equation may be replaced with:

$$\sum_{i=N}^{\infty} \hat{g}(iT)$$

for the gain of the echo channel at a zero frequency $$\sum_{i=0}^{\infty} \hat{g}(iT)$$

is zero; in an echo canceller of length NT, it may be assumed that the echo energy is zero beyond NT, therefore that $$\sum_{i=N}^{\infty} \hat{g}(iT) = 0$$

The echo Ec(nT) is therefore limited to the first term of equation (4 bis), i.e.:

$$Ec(nT) = \sum_{i=0}^{N-1} \hat{g}(iT) \cdot \widehat{qde}((n-i)T) \quad (6 \text{ bis})$$

A parameter q'de(i) may be introduced:

$$\widehat{q'de}(i) = \tfrac{1}{2} \widehat{qde}(i)$$

and then $\widehat{q'de}(i)$ may only assume the values -1, 0, 1 or 2; and, if coefficients $\hat{g}'(i) = 2\hat{g}(i)$ are used, equation (6 bis) may be written:

$$Ec(nT) = \sum_{i=0}^{N-1} \hat{g}'(iT) \cdot \widehat{q'de}((n-i)T) \quad (6 \text{ ter})$$

Thus it can be seen that, provided values which are double of the ECC coefficients are stored, the mathematical products which intervene in the sum may be substituted with:

generation of a zero for $\widehat{qde} = 0$, transparency (equality of the output and of the input with possible sign change) for $\widehat{qde} = 2$ or $-2$, shift of a bit towards the most significant bits for $\widehat{qde} = 4$.

The invention will be better understood from the following description of a particular embodiment, given by way of example, and from the comparison which is made with a known device. The description refers to the accompanying drawings.

DETAILED DESCRIPTION OF THE INVENTION

Figure 1:
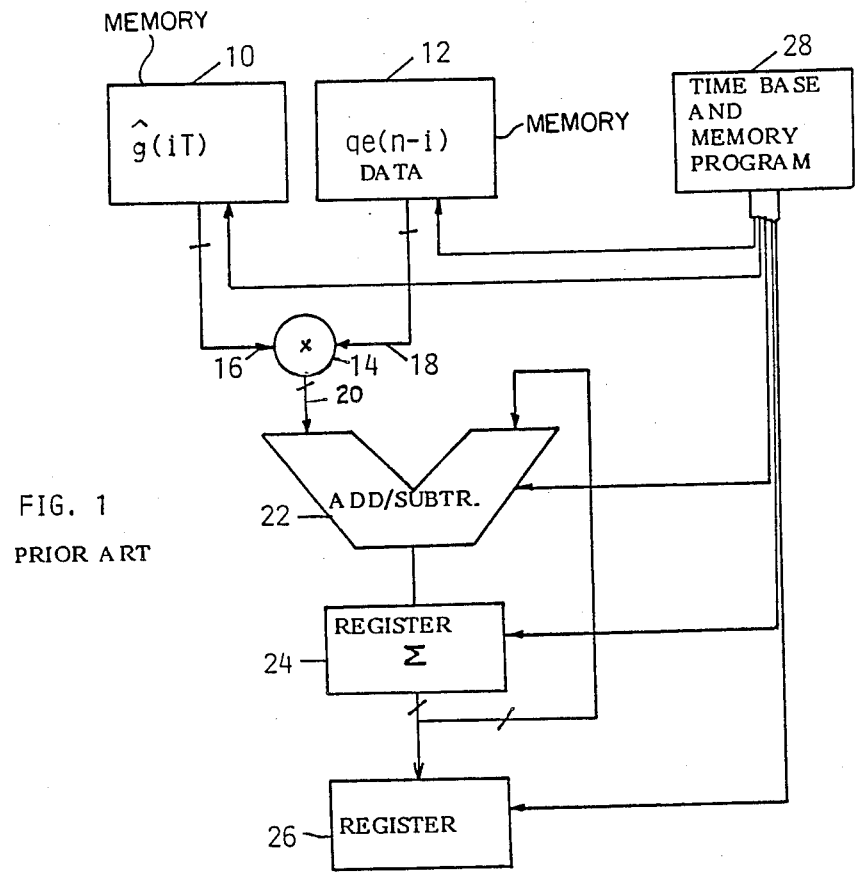
FIG. 1 is a general diagram of a prior art computing device suitable for use in an ECC.

Referring to FIG. 1, a prior art device will be assumed to be for computing estimated successive values of an echo Ec(nT) in real time and uses the above function (2 bis):

$$Ec(nT) = \sum_{i=0}^{N-1} \hat{g}(iT) \cdot qe((n-i)T)$$

where $\hat{g}(iT)$, for $i=0, \ldots, N-1$, are the N coefficients of the echo filter, $qe((n-i)T)$ for $i=0, \ldots, N-1$, are the last N data transmitted in code 2B1Q.

To simplify writing, in what follows the notation $qe(n-i)$ will be used instead of $qe((n-i)T)$.

The device shown in FIG. 1 comprises a memory 10 for storing coefficients $\hat{g}(iT)$. This memory will generally be a RAM associated with an adaptive filter for computing the coefficients by an adaptation algorithm which may be of known type. Examples of such filters can be found in numerous documents, for example U.S. Pat. No. 4,564,934 (Macchi).

A second RAM 12, often including a shift register, receives the last N estimated data qe(n−i), as words of 2 bits in 2B1Q code.

One of the inputs of a multiplier 14 is connected to the data bus 16 of the coefficient storing memory 10 and the other to the output bus 18 of the data memory 12. Bus 20 of the multiplier is connected to one of the two inputs of an adder/subtractor 22. A register 24 for accumulating the results delivered by the adder/subtractor is connected to the output of this latter. At any time it contains the results of the last operation and feeds a second register 26 and the second input of the adder/subtractor. The second register 26 stores the contents of register 24 when the latter contains the final result of the operation, i.e. the result Ec(nT) which may then be read out either by another computer, or by a digital/analog converter (not shown). A circuit 28 forming a time base and containing a program memory makes it possible to control the computing operations by activating the circuits 10, 12, 22, 24 and 26 according to a proper sequence. The sum:

$$Ec(nT) = \sum_{i=0}^{N-1} \hat{g}(iT) \cdot qe(n - i)$$

is available after N computing cycles in the following way, after 24 and 26 have been cleared by the time base.

Cycle 1:
reading out $\hat{g}(0)$ and qe(nT) from memories 10 and 12;
multiplication of $\hat{g}(0)$ with qe(n) in 14;
writing of the result $\hat{g}(0).qe(n)$ into register 24.

Cycle 2:
reading out $\hat{g}(1T)$ and qe(n−1) from the memories;
multiplication of g(1T) with qe(n−1);
addition of the output of the multiplier and of the contents of register 24; namely $\hat{g}(0).qe(n)$;
writing of the result into the register 24. Cycle N:
reading out $\hat{g}((N-1)T)$ and qe(n−N+1) from the memories;
multiplication of $\hat{g}(N-1)$ with qe(n−N+1);
addition of the output of the multiplier and of the contents of register 24

$$\sum_{j=0}^{N-2} \hat{g}(j)qe(n - j)$$

writing of the result $$\sum_{j=0}^{n-1} \hat{g}(j)qe(n - j)$$

into the register 24.

Last, after the Nth cycle, the time base causes transfer of the result from register 24 to output register 26.

Figure 2:
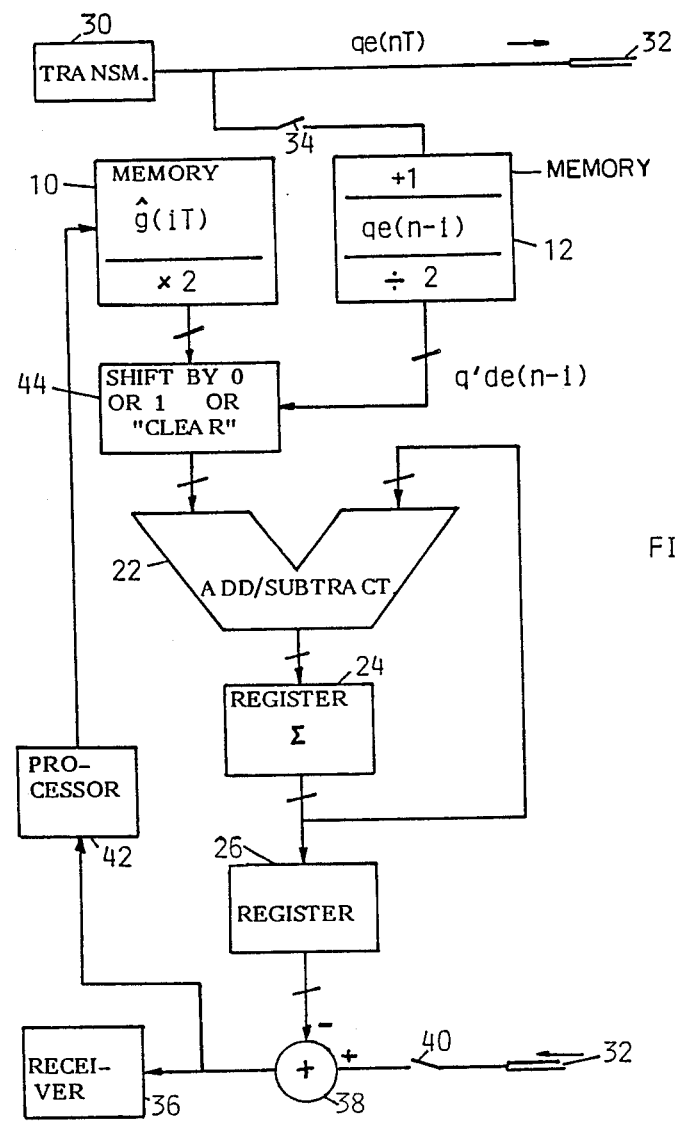
FIG. 2, similar to FIG. 1, is a diagram of an ECC in accordance with the invention.

Referring to FIG. 2, a device of the invention fulfils the same function as that of FIG. 1, without increasing the volume of the memory required for computing Ec(nT), with the same number N of computing cycles for each value, however without a multiplier.

In FIG. 2, the time base and the program memory have not been shown for simplicity. The elements corresponding to those in FIG. 1 bear the same reference number. In addition, to illustrate the arrangement of the echo canceller in a station, FIG. 2 shows schematically a transmitter 30 delivering successive data qe(nT) to a transmission line 32. A sampler 34 provides successive samples which are stored in memory 12 having an adder and a divide-by-two divider for obtaining q'de. The signals coming from the line are applied to the receiver 36 by a computing unit 38 forming an adder having an additive input which receives samples of the signal, delivered by a sampler 40, and a subtractive input which receives the output of memory 26. In general, the device will comprise a circuit 32 for adapting the coefficients $\hat{g}(iT)$ of the echo canceller.

As such, this arrangement of an echo canceller in a transmission/reception station associated with a duplex transmission line is known: a more complete description may be found if required in the paper by FALCONER et al "Adaptive echo cancellation AGC structures for two wire full duplex data transmission" in Bell Technical Journal, Vol. 58, No. 7, September 1979, page 1593, or in U.S. Pat. No. 4,564,934 already mentioned.

However, the device shown in FIG. 2 computes the echo Ec(nT) by applying the above formula (6 ter) rather than a conventional approach. The usual multiplier 14 is substituted with a circuit 44 which is quite simple since it submit the coefficient $\hat{g}(iT)$ to one of three operations, selected in response to the values of the two data bits corresponding to $\hat{q'de}$ (which is obtained by a simple shift of the values $\hat{qde}$ by one position to the right). The three possible operations are:

straight transfer of the input to the output (transparency function) equivalent to a multiplication by 1, when $\hat{q'de}(n-i)=1$ or −1;

shift of the data by 1 position toward the most significant bits (MSBs), equivalent to a multiplication by 2, when $\hat{q'de}(n-i)=2$;

generation of a zero at an output, i.e. multiplication by zero or deletion, when q'de(n−i)=0.

In addition, the sign must be changed when $\hat{q'de}=-1$.

It can be seen that each operation needs one operating cycle only. For example, the cycle i+1 is as follows:
reading out $\hat{g}'(iT)$ and q'de((n−i)T) from the memories,
shift of $\hat{g}'(iT)$ by 1 bit, or zero generation, or "transparency";
addition of the output of 44 with the contents of register 24;
writing of the result into the register 24.

This sequence of operations, for i=0 up to N−1, results into the computation defined by equation (6 ter).

Consequently, without a multiplier, computation may be made in only N cycles. The computer operates then at the same speed as with a conventional construction and the amount of memory required for storing the program is not changed.

An equalizer device can be designed having the same construction as the echo canceller shown schematically in FIG. 2. Operation corresponds then to the above formula (6) and the only additional operation consists in adding the estimated term $\hat{h}(0)$ which in some cases may be selected once for all but, more frequently, will be permanently adapted at the same time as the coefficients H(iT) by implementing a conventional algorithm, such as the gradient algorithm or the sign algorithm.

I claim:

1. A digital computing device for computing in real time a sum of terms of the form:

$$\Sigma h(iT).\hat{q}e((n-i)T)$$

in which
- T designates a sampling period,
- i designates successive instants, at mutual intervals T,
- n is a predetermined integer greater than 1,
- $\hat{q}e$ are estimated values of transmitted data qe coded in code 2B 1Q, each of said transmitted data having one of the values −3, −1, +3 and +1 only, comprising:
  - means for transforming each of the estimated values of data $\hat{q}e$ into transformed values $\hat{q}d\hat{e}$ which are powers of 2, by addition or subtraction of a same number to or from all the estimated values $\hat{q}e$;
  - means for computing successive elementary products each obtained by an operation selected from transfer, change to zero and shift of h(iT) in response to respective values of $\hat{q}d\hat{e}$; and
  - means for summing the successive elementary products.

2. A device according to claim 1, further comprising means for adding a constant value to $\hat{q}d\hat{e}$, said value being an estimation of the difference in result due to the change from $\hat{q}e$ to $\hat{q}d\hat{e}$.

3. Device according to claim 1, further comprising means for transforming said transformed value $\hat{q}d\hat{e}$ into values q'de having one of values 2, 1, 0 and −1, wherein said means for computing elementary products consist of a circuit connected to receive successive values of q'de on a first input and respective successive values of h(iT) on a second input and arranged to deliver, on an output:
- the respective value of h(iT), responsive to q'de being equal to 1 or −1,
- a zero, responsive to q'de being 0,
- the value of h(iT) applied to the second input responsive to q'de being equal to 2.

4. A digital computing device for computing in real time a sum of terms of the form:

$$\Sigma h(iT) \cdot \hat{q}e((n-i)T)$$

in which
- T designates a sampling period,
- i designates successive instants, at mutual intervals T,
- n is a predetermined integer greater than 1,
- $\hat{q}e$ are estimated values of transmitted data qe coded in code 2B 1Q, each of said transmitted data having one of the values −3, −1, +3 and +1 only, comprising:
  - summing means for transforming each of the estimated values of data $\hat{q}e$ into transformed values $\hat{q}d\hat{e}$ which are powers of 2, by adding 1 to each of the estimated values $\hat{q}e$;
  - divider-by-two means connected to an output of said summing means and delivering a value q'de having one of the values 2, 1 0 and −1 on an output thereof;
  - means for computing successive elementary products each obtained by an operation selected from transfer, change to zero and shift of h(iT) in response to respective values of q'de.

5. A device according to claim 4, further comprising means for sampling said transmitted data qe received from an emitter and for delivering said samples to said means for transforming each of the estimated values into transformed values, wherein said means for summing the successive elementary products include a summation register and adder means having an output connected to the input of said summing register and input respectively connected to the output of said means for computing the elementary products and to the output of the summing register.

* * * * *